(12) United States Patent
Cheng (10) Patent No.: US 10,423,286 B1
(45) Date of Patent: Sep. 24, 2019

(54) CIRCUIT FOR FINGERPRINT SENSING AND ELECTRONIC DEVICE COMPRISING THE CIRCUIT

(71) Applicant: INT TECH CO., LTD., Hsinchu County (TW)

(72) Inventor: Shih-Song Cheng, Kaohsiung (TW)

(73) Assignee: INT TECH CO., LTD., Hsinchu County (TW)

( * ) Notice: Subject to any disclaimer, the term of this patent is extended or adjusted under 35 U.S.C. 154(b) by 16 days.

(21) Appl. No.: 15/916,610

(22) Filed: Mar. 9, 2018

(51) Int. Cl.
*G06F 3/045* (2006.01)
*G06F 3/044* (2006.01)
*G06F 3/041* (2006.01)
*H01L 27/06* (2006.01)
*G06K 9/00* (2006.01)

(52) U.S. Cl.
CPC ............ *G06F 3/044* (2013.01); *G06F 3/0416* (2013.01); *G06K 9/0002* (2013.01); *H01L 27/0629* (2013.01); *G06F 3/0412* (2013.01)

(58) Field of Classification Search
CPC .... G06F 3/041; G06F 3/0412; G06F 3/04144; G06F 3/0416; G06F 3/044; G06K 9/0002; H01L 27/0629
See application file for complete search history.

(56) References Cited

U.S. PATENT DOCUMENTS 9,318,540 B2* 4/2016 Qing ..................... G09G 3/3233
10,262,589 B2* 4/2019 Cheng .................. G09G 3/3233

2007/0040772 A1* 2/2007 Kim ..................... G09G 3/3233
345/76
2011/0001711 A1* 1/2011 Choi ..................... G06F 3/0412
345/173
2011/0134100 A1* 6/2011 Chung ................... G09G 3/325
345/212
2012/0293479 A1* 11/2012 Han ....................... G09G 3/003
345/212

(Continued)

FOREIGN PATENT DOCUMENTS

TW 201503085 A 1/2015
TW 201706808 A 2/2017

OTHER PUBLICATIONS

Office Action and Search Report dated May 7, 2019 issued by Taiwan Intellectual Property Office for counterpart application No. 107128832.

(Continued)

*Primary Examiner* — Joe H Cheng
(74) *Attorney, Agent, or Firm* — WPAT, P.C., Intellectual Property Attorneys; Anthony King (57) ABSTRACT

A circuit for fingerprint detection is disclosed. The circuit includes a transistor and a capacitor. The transistor includes a gate configured to, in response to a touch event of an object, sense a capacitance associated with the object. The capacitor, coupled between a first node and a second node, is configured to establish a voltage across the first node and the second node in response to a first control signal, and establish a compensation voltage at the first node in response to a second control signal. The transistor is configured to flow a current therethrough in response to a third control signal. The current has a magnitude independent of the threshold voltage of the transistor due to the compensation voltage.

19 Claims, 8 Drawing Sheets

(56) References Cited

U.S. PATENT DOCUMENTS

| | | | |
|---|---|---|---|
| 2014/0168127 A1* | 6/2014 | Yang | G06F 3/0412 345/173 |
| 2014/0225878 A1* | 8/2014 | Shih | G09G 3/3258 345/205 |
| 2014/0333515 A1 | 11/2014 | In et al. | |
| 2015/0138253 A1* | 5/2015 | Kimura | G09G 3/3266 345/690 |
| 2015/0356924 A1* | 12/2015 | Chen | G09G 3/3233 345/690 |
| 2016/0117983 A1* | 4/2016 | Li | G09G 3/3233 345/76 |
| 2016/0148569 A1* | 5/2016 | Park | G09G 3/3233 345/212 |
| 2016/0179256 A1* | 6/2016 | Yang | G06F 3/0412 345/173 |
| 2016/0180775 A1* | 6/2016 | Kim | G09G 3/3233 345/205 |
| 2016/0203794 A1* | 7/2016 | Lim | G09G 3/3225 345/213 |
| 2016/0246409 A1* | 8/2016 | Yang | G06F 3/0412 |
| 2016/0253014 A1 | 9/2016 | Yang | |
| 2016/0266688 A1* | 9/2016 | Yang | G06F 3/041 |
| 2016/0274692 A1* | 9/2016 | Yang | G06F 3/044 |
| 2016/0284269 A1* | 9/2016 | Sun | G09G 3/3233 |
| 2017/0046006 A1 | 2/2017 | Kim et al. | |
| 2017/0069263 A1* | 3/2017 | Hu | G09G 3/32 |
| 2017/0069264 A1* | 3/2017 | Dai | G09G 3/3233 |
| 2017/0092193 A1* | 3/2017 | Na | G09G 3/3233 |
| 2017/0124941 A1* | 5/2017 | Na | G09G 3/2092 |
| 2017/0153759 A1* | 6/2017 | Ding | G09G 3/32 |
| 2017/0162121 A1* | 6/2017 | Yang | G06F 3/007 |
| 2017/0199616 A1* | 7/2017 | Kim | G09G 3/3233 |
| 2017/0229070 A1* | 8/2017 | Ma | G09G 3/3258 |
| 2017/0269783 A1* | 9/2017 | Yang | G06F 3/0412 |
| 2018/0137814 A1* | 5/2018 | Yang | G06F 3/0412 |
| 2018/0137816 A1* | 5/2018 | Cheng | G09G 3/2092 |

OTHER PUBLICATIONS

English Abstract Translation of Office Action and Search Report.
US Patent Publication 20140333515 is the counterpart application to Foreign Patent Document TW201503085A.
US Patent Publication 20170046006 is the counterpart application to Foreign Patent Document TW201706808A.

* cited by examiner

CIRCUIT FOR FINGERPRINT SENSING AND ELECTRONIC DEVICE COMPRISING THE CIRCUIT

BACKGROUND

Nowadays, touch devices are widely used in conjunction with electronic devices such as smart phones and laptop computers. With touch devices, a user can easily operate on a smart phone or a laptop computer. While touch devices bring a new era of user interface, touch sensitivity has been the subject of interest in developing advanced touch devices.

SUMMARY

Embodiments of the present invention provide a circuit that includes a transistor and a capacitor. The transistor includes a gate configured to, in response to a touch event of an object, sense a capacitance associated with the object. The capacitor is coupled between a first node and a second node, wherein the first node is coupled to the gate of the transistor. The capacitor is configured to establish a voltage across the first node and the second node in response to a first control signal. The voltage equals a threshold voltage of the transistor. In addition, the capacitor is configured to establish a compensation voltage at the first node in response to a second control signal. The transistor is configured to flow a current therethrough in response to a third control signal. The current has a magnitude independent of the threshold voltage of the transistor due to the compensation voltage.

In an embodiment, the transistor includes a first terminal configured to receive a supply voltage, and the compensation voltage equals to the supply voltage minus the threshold voltage of the transistor.

In another embodiment, the magnitude of the current is zero.

In yet another embodiment, the circuit further includes a first transistor that includes a gate to receive the third control signal, a first terminal to receive a reference voltage, and a second terminal coupled to the second node of the capacitor.

In still another embodiment, the transistor includes a first terminal configured to receive a supply voltage, and a difference made in a voltage at the first node in response to the third control signal is expressed as:

$$\Delta VA = (VDD - Vref) \times \left[\frac{Cfinger}{C1 + Cfinger}\right]$$

where $\Delta VA$ represents the difference made in the voltage at the first node, VDD represents the supply voltage, Vref represents the reference voltage, C1 represents a capacitance of the capacitor, and Cfinger represents the capacitance associated with the object.

In yet still another embodiment, a difference made in the current in response to the third control signal is positively proportional to the $\Delta VA$ squared and is expressed as:

$$\Delta |Ids3| \propto \left[(VDD - Vref) \times \left(\frac{Cfinger}{C1 + Cfinger}\right)\right]^2$$

where $\Delta |Ids3|$ represents the difference made in the current.

In still yet another embodiment, the transistor includes a first terminal configured to receive a supply voltage, and the circuit further includes a second transistor that includes a gate to receive the third control signal, a first terminal coupled to a second terminal of the transistor, and a second terminal to output the current flowing through the transistor.

In an embodiment, the circuit further includes a fourth transistor including a gate to receive the first control signal, a first terminal to receive a supply voltage, and a second terminal coupled to the first node.

In another embodiment, the circuit further includes a fifth transistor that includes a gate to receive the first control signal, a first terminal to receive the second control signal, and a second terminal coupled to the second node.

In yet another embodiment, the circuit further includes a sixth transistor that includes a gate to receive the second control signal, a first terminal to receive a supply voltage, and a second terminal coupled to the second node.

In still another embodiment, the circuit further includes a sixth transistor that includes a gate to receive the second control signal, a first terminal to receive the first control signal, and a second terminal coupled to the second node.

In yet still another embodiment, the circuit further includes a sixth transistor that includes a gate to receive the second control signal, a first terminal to receive the third control signal, and a second terminal coupled to the second node.

In still yet another embodiment, the transistor includes a first terminal configured to receive a supply voltage, and the circuit further includes a seventh transistor that includes a gate to receive the second control signal, a first terminal coupled to the first node, and a second terminal coupled to a second terminal of the transistor.

Embodiments of the present invention provide an electronic device that includes an array of sensor units. Each of the sensor units includes a transistor and a capacitor. The transistor includes a gate configured to, in response to a touch event of an object, sense a capacitance associated with the object. The capacitor is coupled between a first node and a second node, wherein the first node is coupled to the gate of the transistor. The capacitor is configured to establish a voltage across the first node and the second node in response to a first control signal. The voltage equals a threshold voltage of the transistor. In addition, the capacitor is configured to establish a compensation voltage at the first node in response to a second control signal. The transistor is configured to flow a current therethrough in response to a third control signal. The current has a magnitude independent of the threshold voltage of the transistor due to the compensation voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

Figure 1:
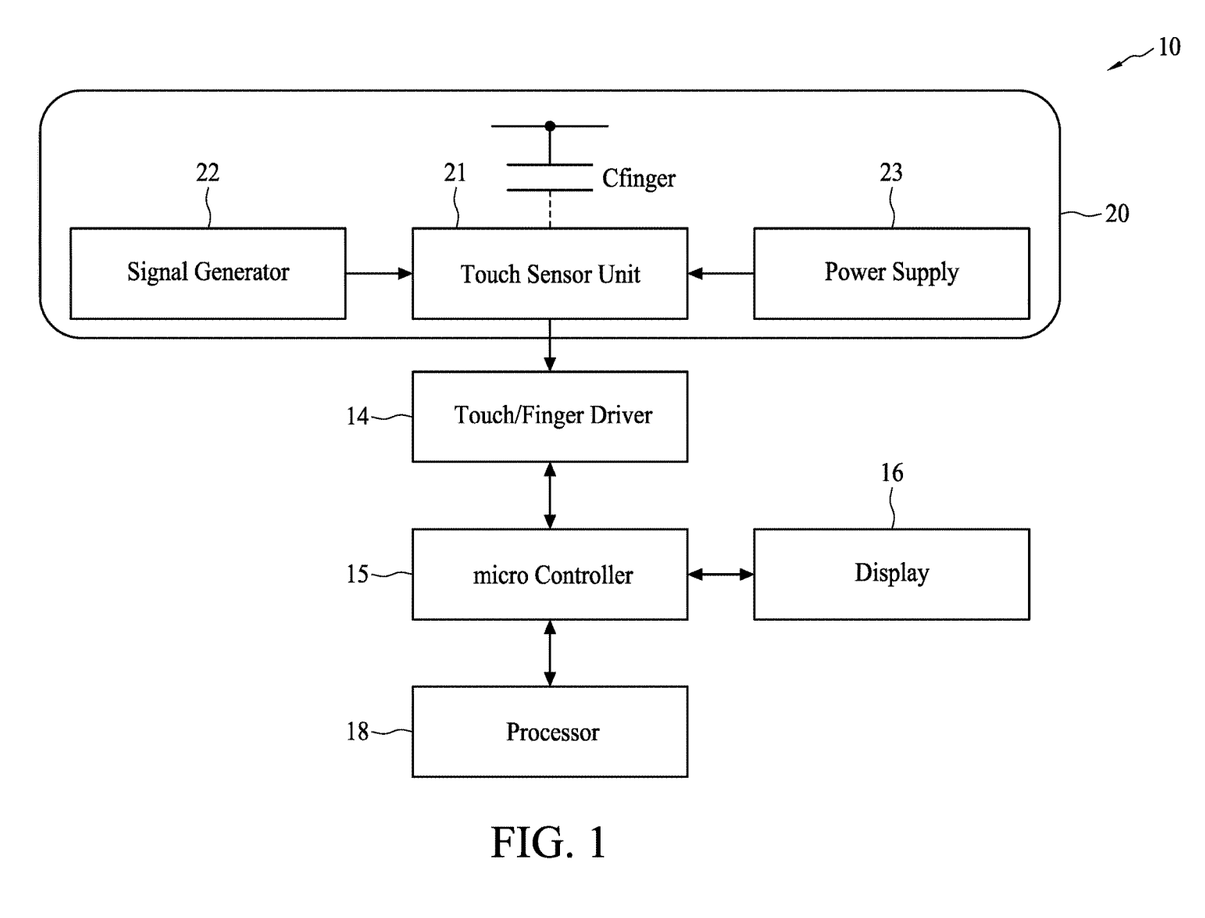
FIG. 1 is a block diagram of an electronic device for active sensing, in accordance with an embodiment.

FIG. 1 is a block diagram of an electronic device 10 for active sensing, in accordance with an embodiment. Examples of the electronic device 10 include computing devices such as cell phones, smartphones, netbooks, laptops, tablets and iPods.

Referring to FIG. 1, the electronic device 10 includes a sensing module 20, a driver 14, a micro controller 15, a display 16 and a processor 18. The sensing module 20 is configured to, under control of the micro controller 15 via the driver 14, detect the presence of an object (represented by Cfinger), for example, a fingerprint of a user. Information on the object, such as ridge or valley data related to the fingerprint, is sent to the processor 18 for further processing. The sensing module 20 includes a sensor unit 21, powered by a power supply 23, for detecting the object in response to control signals SENSE, S1 and S2 provided by a signal generator 22.

Figure 2:
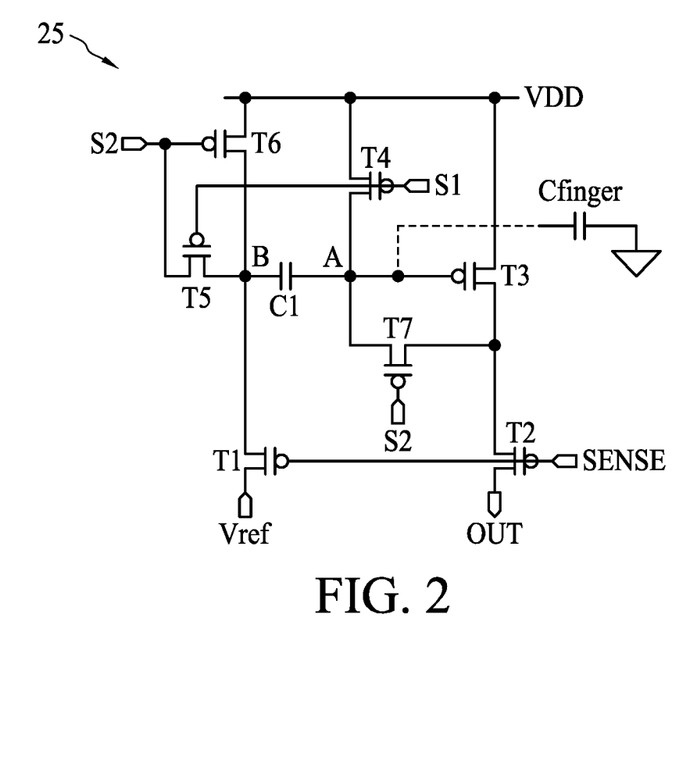
FIG. 2 is a circuit diagram of an equivalent circuit of a sensing module in the electronic device illustrated in FIG. 1, in accordance with an embodiment.

FIG. 2 is a circuit diagram of an equivalent circuit 25 of the sensing module 20 in the electronic device 10 illustrated in FIG. 1, in accordance with an embodiment.

Referring to FIG. 2, the circuit 25 includes transistors T1 to T7 and a capacitor C1. The capacitor C1 serves as a storage capacitor. In the present embodiment, each of the transistors T1 to T7 includes a p-type thin film transistor (TFT) or a p-type metal-oxide-semiconductor (PMOS) transistor.

A gate of the fourth transistor T4 receives a first control signal S1. In addition, a drain of the transistor T4 is coupled to a first node A at one terminal of the capacitor C1. Further, a source of transistor T4 receives a supply voltage VDD, for example, approximately five (5) volts. Persons having ordinary skill in the art will understand that drain and source terminals of a MOS transistor may be interchangeable, depending on voltage levels applied thereto.

A gate of the seventh transistor T7 receives a second control signal S2. In addition, a drain of the transistor T7 is coupled to the first node A at the one terminal of the capacitor C1. Moreover, a gate of the sixth transistor T6 also receives the second control signal S2. In addition, a source of the transistor T6 receives the supply voltage VDD. Further, a drain of the transistor T6 is coupled to a second node B at the other terminal of the capacitor C1.

A gate of the first transistor T1 receives a third control signal SENSE. In addition, a drain of the transistor T1 receives a reference voltage Vref, for example, a ground voltage. Further, a source of the transistor T1 is coupled to the second node B at the other terminal of the capacitor C1.

Moreover, a gate of the second transistor T2 also receives the third control signal SENSE. A source of the transistor T2 is coupled to a source of the transistor T7. In addition, a drain of the transistor T2 provides an output OUT.

A gate of the fifth transistor T5 also receives the first control signal S1. In addition, a source of the transistor T5 receives the second control signal S2. Further, a drain of the transistor T5 is coupled to the second node B at the other terminal of the capacitor C1.

A gate of the third transistor T3 is coupled to the first node A and hence the drains of the transistors T4 and T7. In addition, a source of the transistor T3 receives the supply voltage VDD. Further, a drain of the transistor T3 is coupled to source terminals of the transistors T2 and T7. The third transistor T3 is configured to detect if there is a touch or contact of an object on the electronic device 10. In the equivalent circuit 25 of FIG. 2, an object is deemed as a ground. Accordingly, in the absence of a touch event, as shown by dashed lines in FIG. 2, no capacitance exists between the gate of transistor T3 and the ground. Contrarily, in the presence of a touch event, a capacitance Cfinger between the gate of transistor T3 and the ground is detected. For convenience, the reference labels Cfinger and C1 represent capacitors and their respective capacitances as well. Operations of the circuit 25 will be discussed in detail with reference to FIGS. 3A and 3B, 4A and 4B, and 5A and 5B.

Figure 3A:
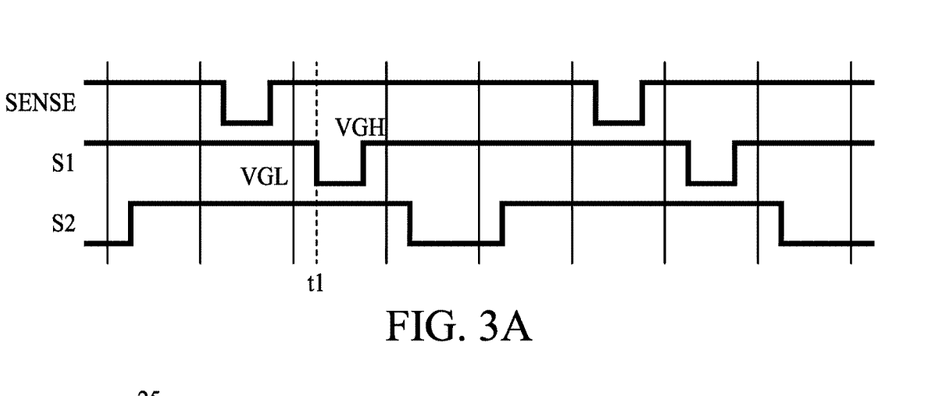
FIGS. 3A and 3B are diagrams showing a method of operating the circuit illustrated in FIG. 2 in a first phase, in accordance with some embodiments.
Figure 3B:
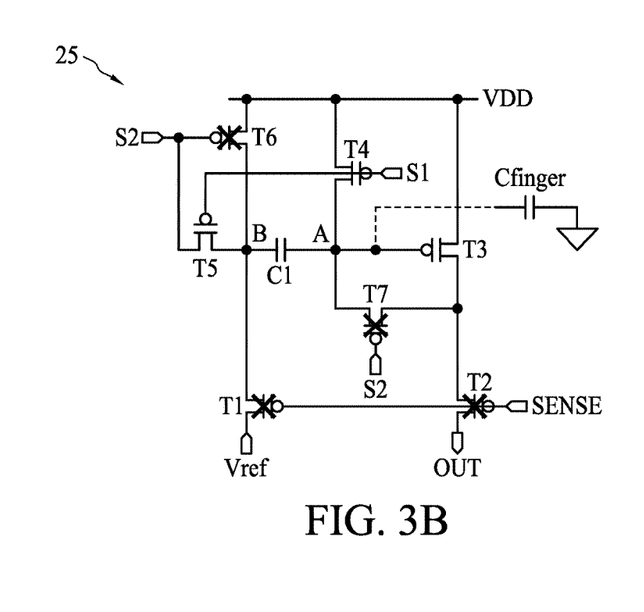

FIGS. 3A and 3B are diagrams showing a method of operating the circuit 25 illustrated in FIG. 2 in a first phase, in accordance with some embodiments.

Referring to FIG. 3A, the control signals S1, S2 and SENSE are configured to be active low in view of the p-type transistors T1 to T7. At time t1, the first control signal S1 is asserted at a falling edge VGL, while the second control signal S2 and the third control signal SENSE are kept at a high logical level VGH. As a result, referring to FIG. 3B, the transistors T4 and T5 are turned on, while the transistors T1, T2, T6 and T7 are turned off (labeled with a cross sign "X"). Since the transistor T4 is turned on, a voltage level at the first node A, denoted as VA, is pulled high to VDD. In addition, VA is equal to a gate potential of the third transistor T3 because the gate of transistor T3 is coupled to the first node A. Moreover, since the transistor T5 is turned on and the second control signal is kept at VGH, a voltage level at the second node B, denoted as VB, is pulled to VGH. As a result, a voltage across the capacitor C1, denoted as VBA, is VGH-VDD. In an embodiment, VGH is larger than VDD at least by |Vth3|, where Vth3 is the threshold voltage of the third transistor T3.

Referring back to FIGS. 1 and 2, the electronic device 10 may comprise an array of sensor units 21 each being associated with a sub-pixel in a pixel area. The threshold voltages Vth3 of third transistors T3 in the array may be different from each other due to manufacturing factors. Consequently, current flowing through the transistors T3 may be different from each other, causing different sensing results in the transistors T3 across the pixel area. To achieve a reliable sensing result, a compensation voltage is established to alleviate the problem of non-uniform current due to manufacturing factors.

Figure 4A:
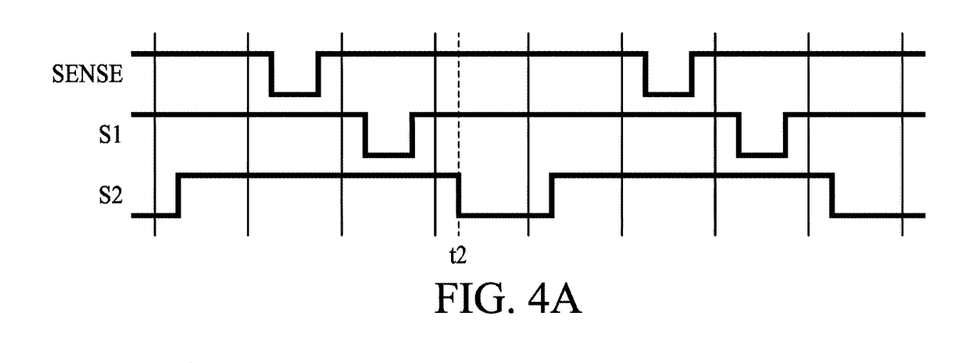
FIGS. 4A and 4B are diagrams showing a method of operating the circuit illustrated in FIG. 2 in a second phase, in accordance with some embodiments.
Figure 4B:
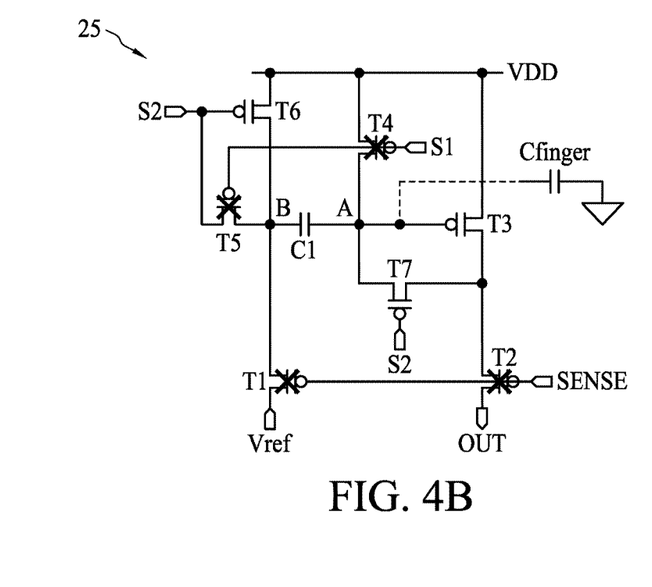

FIGS. 4A and 4B are diagrams showing a method of operating the circuit 25 illustrated in FIG. 2 in a second phase, in accordance with some embodiments.

Referring to FIG. 4A, at time t2, the first control signal S1 becomes logically high, the second control signal S2 is asserted, and the third control signal SENSE is kept at a high logical level. As a result, referring to FIG. 4B, the transistors T6 and T7 are turned on, while the transistors T4 and T5 are turned off and the transistors T1 and T2 are kept at an off state. Since the transistor T6 is turned on, the second node B is coupled to VDD, and thus the capacitor C1 is charged from the supply power VDD. Moreover, since during the first phase, VBA (=VGH−VDD=|Vth3|) across the capacitor C1 is established, when the charging process completes, VB equals VDD, and VA becomes VDD−|Vth3| by function of coupling effect of the capacitor C. Current Ids3 flowing through the third transistor T3 in the second phase can be expressed in equation (1) below.

$$|Ids3|=k\times(|Vgs3|-|Vth3|)^2 \qquad \text{equation (1)}$$

where k is a constant, Vgs3 represents a gate to source voltage of the third transistor T3.

By substituting |Vgs3|=|VA−VDD|=|VDD−|Vth3|−VDD|=|Vth3| into equation (1), it is found that |Ids3| equals zero. Effectively, by establishing a compensation voltage at the gate of the transistor T3, the current |Ids3| substantially equals zero, which paves the way for determining a sensing result in a sensing phase, as will be discussed with reference to FIGS. 5A and 5B.

Figure 5A:
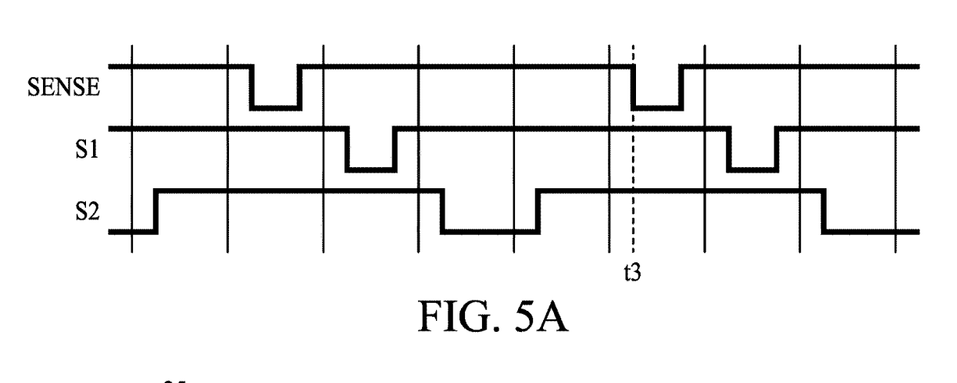
FIGS. 5A and 5B are diagrams showing a method of operating the circuit illustrated in FIG. 2 in a third phase, in accordance with some embodiments.
Figure 5B:
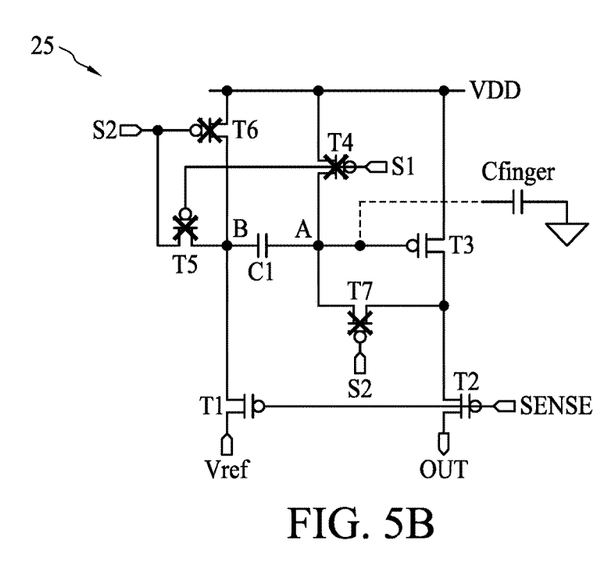

FIGS. 5A and 5B are diagrams showing a method of operating the circuit 25 illustrated in FIG. 2 in a third phase, in accordance with some embodiments.

Referring to FIG. 5A, at time t3, the third control signal SENSE is asserted at a falling edge, which triggers a sensing operation. Moreover, the first control signal S1 is kept at a high logical level, and the second control signal S2 has become logically high. As a result, referring to FIG. 5B, the transistors T1 and T2 are turned on, the transistors T6 and T7 are turned off, and the transistors T4 and T5 are kept at an off state. Since the transistor T1 is turned on, VB is pulled low to the reference voltage Vref from VDD. During the third phase, VA is floating and thus VA and VB are equal potential. As VB changes from VDD to Vref, VA also changes accordingly. A difference thus made in VA in the third phase, denoted as ΔVA, is expressed in equation (2) below.

$$\Delta VA = (VDD - Vref)\times\left[1 - \frac{C1}{C1+Cfinger}\right] = \qquad \text{equation (2)}$$
$$(VDD - Vref)\times\left[\frac{Cfinger}{C1+Cfinger}\right]$$

where Cfinger equals zero in the absence of a touch event.

In an embodiment, the capacitance C1 is significantly small as compared to the capacitance Cfinger. In addition, VDD minus Vref approaches VDD. As a result, $$(VDD-Vref)\times\left(\frac{Cfinger}{C1+Cfinger}\right)$$

is a relatively large value that may equal approximately VDD, which facilitates the sensitivity of the circuit 25 in detection.

Further, in the third phase a difference made in the current |Ids3| (which has been compensated in the second phase), denoted as Δ|Ids3|, can be expressed as follows.

$$\Delta|Ids3| \propto (\Delta VA)^2 = \left[(VDD-Vref)\times\left(\frac{Cfinger}{C1+Cfinger}\right)\right]^2$$

Since the second transistor T2 is turned on, the difference in current, ΔIds3|, is output as a sensing result in the third phase and may then be processed by the processor 18 in FIG. 1. As previously discussed, $$(VDD-Vref)\times\left(\frac{Cfinger}{C1+Cfinger}\right)$$

is a relatively large value. The sensing output Δ|Ids3|, which is positively proportional to the $$(VDD-Vref)\times\left(\frac{Cfinger}{C1+Cfinger}\right)$$

squared, is also a relatively large value as far as a sensing result is concerned.

Accordingly, embodiments of the present disclosure provide a circuit and a method for sensing an object by using active components such as transistors. Some embodiments also provide a circuit and a method for compensating transistors for electric variation due to manufacturing factors, thereby alleviating the problem of non-uniform sensing results. Moreover, embodiments also provide a circuit and a method for providing a sensing output in the form of current, which enhances sensing precision and sensitivity of the electronic device 10.

Figure 6A:
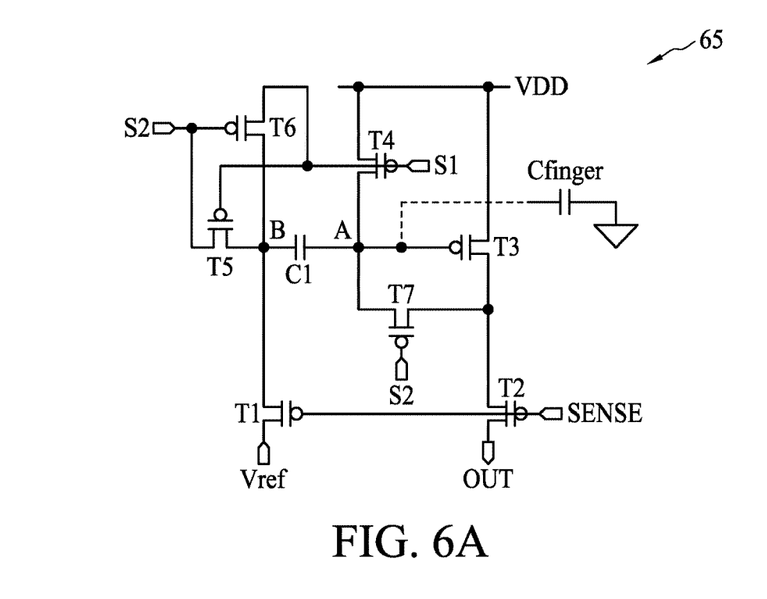
FIG. 6A is a circuit diagram of an equivalent circuit of a sensing module in the electronic device illustrated in FIG. 1, in accordance with another embodiment.

FIG. 6A is a circuit diagram of an equivalent circuit 65 of a sensing module 20 in the electronic device 10 illustrated in FIG. 1, in accordance with another embodiment.

Referring to FIG. 6A, the circuit 65 is similar to the circuit 25 described and illustrated with reference to FIG. 2 except that, for example, the source of the sixth transistor T6 receives the first control signal S1 instead of the supply voltage VDD.

Figure 6B:
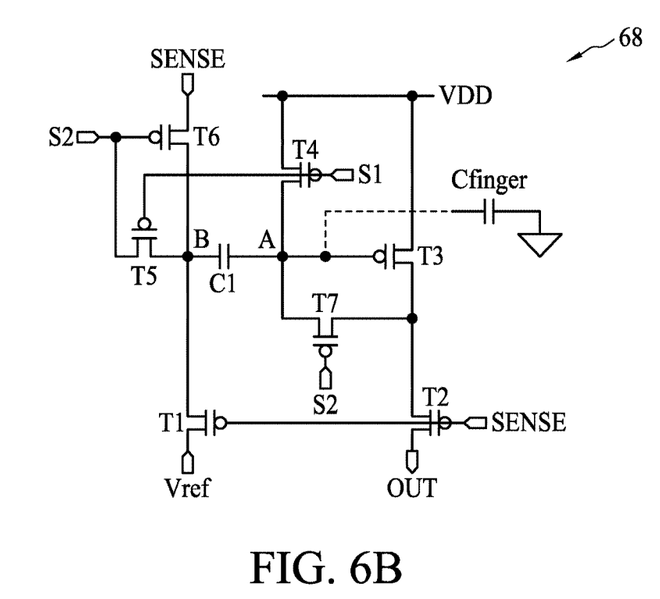
FIG. 6B is a circuit diagram of an equivalent circuit of a sensing module in the electronic device illustrated in FIG. 1, in accordance with yet another embodiment.

FIG. 6B is a circuit diagram of an equivalent circuit 68 of a sensing module 20 in the electronic device 10 illustrated in FIG. 1, in accordance with yet another embodiment.

Referring to FIG. 6B, the circuit 68 is similar to the circuit 25 described and illustrated with reference to FIG. 2 except that, for example, the source of the sixth transistor T6 receives the third control signal SENSE instead of the supply voltage VDD.

Figure 7A:
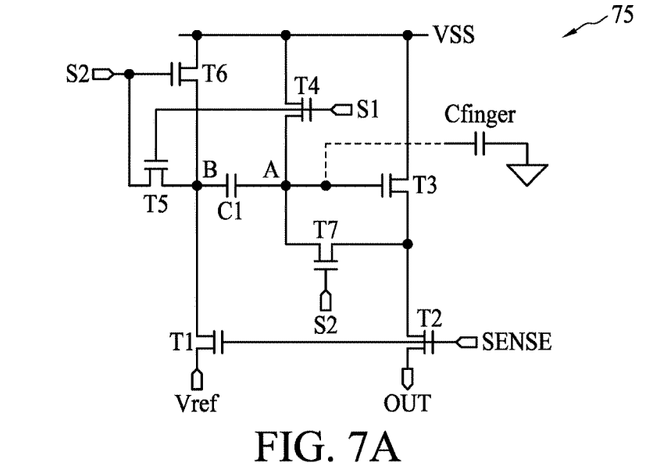
FIG. 7A is a circuit diagram of an equivalent circuit of a sensing module in the electronic device illustrated in FIG. 1, in accordance with still another embodiment.

FIG. 7A is a circuit diagram of an equivalent circuit 75 of a sensing module 20 in the electronic device 10 illustrated in FIG. 1, in accordance with still another embodiment.

Referring to FIG. 7A, the circuit 75 is similar to the circuit 25 described and illustrated with reference to FIG. 2 except that, for example, n-type TFTs or NMOS transistors replace the p-type TFTs or PMOS transistors T1 to T7 in FIG. 2.

Specifically, the capacitor C1 is coupled between the first node A and the second node B. A gate of the first transistor T1 receives the third control signal SENSE. A source of the first transistor T1 receives Vref. A drain of the transistor T1 is coupled to the second node B. In addition, a gate of the second transistor T2 also receives the third control signal SENSE. A source of the transistor T2 provides an output OUT. Moreover, a gate of the third transistor T3 is coupled to the first node A. A drain of the transistor T3 receives a supply voltage VSS. A source of the transistor T3 is coupled to a drain of the second transistor T2. Furthermore, a gate of the fourth transistor T4 receives the first control signal S1. A drain of the transistor T4 receives the supply voltage VSS. A source of the transistor T4 is coupled to the first node A and hence to the gate of the third transistor T3. In addition, a gate of the fifth transistor T5 also receives the first control signal S1. A drain of the transistor T5 receives the second control signal S2. A source of the transistor T5 is coupled to the second node B and hence to the drain of the first transistor T1. Moreover, a gate of the sixth transistor T6 receives the second control signal S2. A source of the transistor T6 is coupled to the second node B and hence to the source of the fifth transistor T5 and the drain of the first transistor T1. A drain of the transistor T6 receives the supply voltage VSS. Furthermore, a gate of the seventh transistor T7 receives the second control signal S2. A drain of the transistor T7 is coupled to the first node A and hence to the gate of the third transistor T3 and the source of the fourth transistor T4. A source of the transistor T7 is coupled to the drain of the second transistor T2 and the source of the third transistor T3.

Figure 7B:
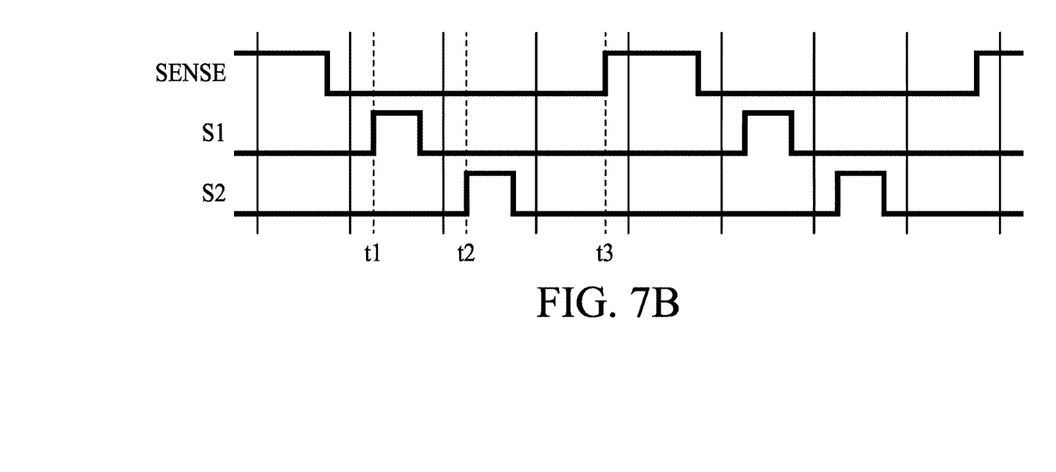
FIG. 7B is a waveform diagram of control signals for operating the circuit illustrated in FIG. 7A, in accordance with some embodiments.

FIG. 7B is a waveform diagram of control signals S1, S2 and SENSE for operating the circuit 75 illustrated in FIG. 7A, in accordance with some embodiments.

Referring to FIG. 7B, the control signals S1, S2 and SENSE are similar to those described and illustrated with reference to FIG. 3A, 4A or 5A except that, for example, the control signals S1, S2 and SENSE in FIG. 7B are active high or asserted at a rising edge in view of n-type transistors T1 to T7.

Figure 8A:
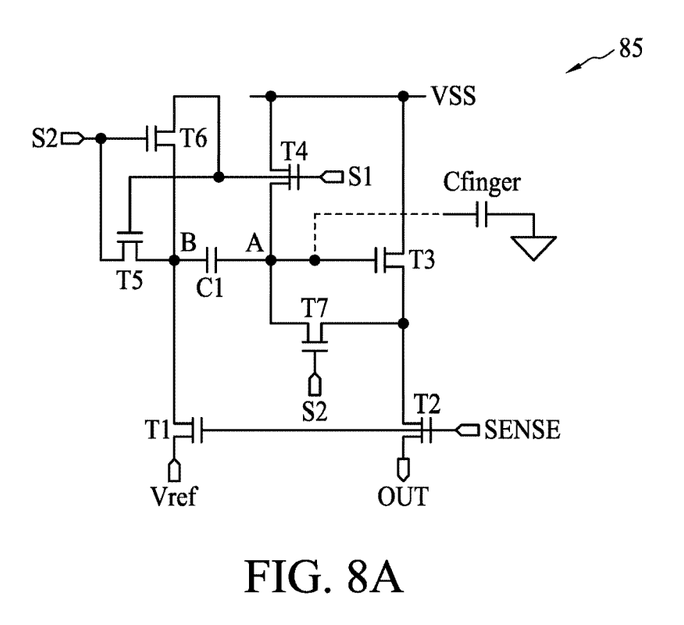
FIG. 8A is a circuit diagram of an equivalent circuit of a sensing module in the electronic device illustrated in FIG. 1, in accordance with yet still another embodiment.

FIG. 8A is a circuit diagram of an equivalent circuit 85 of a sensing module 20 in the electronic device 10 illustrated in FIG. 1, in accordance with yet still another embodiment.

Referring to FIG. 8A, the circuit 85 is similar to the circuit 75 described and illustrated with reference to FIG. 7 except that, for example, the drain of the sixth transistor T6 receives the first control signal S1 instead of the supply voltage VSS.

Figure 8B:
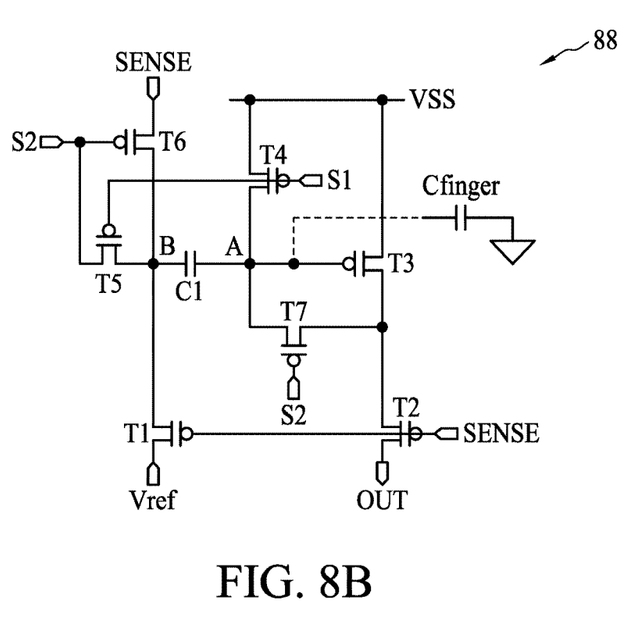
FIG. 8B is a circuit diagram of an equivalent circuit of a sensing module in the electronic device illustrated in FIG. 1, in accordance with yet still another embodiment.

FIG. 8B is a circuit diagram of an equivalent circuit 88 of a sensing module 20 in the electronic device 10 illustrated in FIG. 1, in accordance with yet still another embodiment.

Referring to FIG. 8B, the circuit 88 is similar to the circuit 75 described and illustrated with reference to FIG. 7 except that, for example, the drain of the sixth transistor T6 receives the third control signal SENSE instead of the supply voltage VSS.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a transistor including a gate configured to, in response to a touch event of an object, sense a capacitance associated with the object; and
a capacitor, coupled between a first node and a second node, the first node coupled to the gate of the transistor, the capacitor configured to establish a voltage across the first node and the second node in response to a first control signal, the voltage equal to a threshold voltage of the transistor, and establish a compensation voltage at the first node in response to a second control signal,
wherein the transistor is configured to flow a current therethrough in response to a third control signal, the current having a magnitude independent of the threshold voltage of the transistor due to the compensation voltage.

2. The circuit according to claim 1, wherein the transistor includes a first terminal configured to receive a supply voltage, and the compensation voltage equals to the supply voltage minus the threshold voltage of the transistor.

3. The circuit according to claim 2, wherein the magnitude of the current is zero.

4. The circuit according to claim 1 further comprising a first transistor including a gate to receive the third control signal, a first terminal to receive a reference voltage, and a second terminal coupled to the second node of the capacitor.

5. The circuit according to claim 4, wherein the transistor includes a first terminal configured to receive a supply voltage, and a difference made in a voltage at the first node in response to the third control signal is expressed as:

$$\Delta VA = (VDD - Vref) \times \left[\frac{Cfinger}{C1 + Cfinger}\right]$$

where $\Delta VA$ represents the difference made in the voltage at the first node, VDD represents the supply voltage, Vref represents the reference voltage, C1 represents a capacitance of the capacitor, and Cfinger represents the capacitance associated with the object.

6. The circuit according to claim 5, wherein a difference made in the current in response to the third control signal is positively proportional to the ΔVA squared and is expressed as:

$$\Delta |Ids3| \propto \left[(VDD - Vref) \times \left(\frac{Cfinger}{C1 + Cfinger}\right)\right]^2$$

where Δ|Ids3| represents the difference made in the current.

7. The circuit according to claim 1, wherein the transistor includes a first terminal configured to receive a supply voltage, further comprising a second transistor including a gate to receive the third control signal, a first terminal coupled to a second terminal of the transistor, and a second terminal to output the current flowing through the transistor.

8. The circuit according to claim 1 further comprising a fourth transistor including a gate to receive the first control signal, a first terminal to receive a supply voltage, and a second terminal coupled to the first node.

9. The circuit according to claim 1 further comprising a fifth transistor including a gate to receive the first control signal, a first terminal to receive the second control signal, and a second terminal coupled to the second node.

10. The circuit according to claim 1 further comprising a sixth transistor including a gate to receive the second control signal, a first terminal to receive a supply voltage, and a second terminal coupled to the second node.

11. The circuit according to claim 1 further comprising a sixth transistor including a gate to receive the second control signal, a first terminal to receive the first control signal, and a second terminal coupled to the second node.

12. The circuit according to claim 1 further comprising a sixth transistor including a gate to receive the second control signal, a first terminal to receive the third control signal, and a second terminal coupled to the second node.

13. The circuit according to claim 1, wherein the transistor includes a first terminal configured to receive a supply voltage, further comprising a seventh transistor including a gate to receive the second control signal, a first terminal coupled to the first node, and a second terminal coupled to a second terminal of the transistor.

14. An electronic device, comprising:
an array of sensor units, each of the sensor units comprising:
a transistor including a gate configured to, in response to a touch event of an object, sense a capacitance associated with the object, and
a capacitor, coupled between a first node and a second node, the first node coupled to the gate of the transistor, the capacitor configured to establish a voltage across the first node and the second node in response to a first control signal, the voltage equal to a threshold voltage of the transistor, and establish a compensation voltage at the first node in response to a second control signal,
wherein the transistor is configured to flow a current therethrough in response to a third control signal, the current having a magnitude independent of the threshold voltage of the transistor due to the compensation voltage.

15. The electronic device according to claim 14, wherein the transistor includes a first terminal configured to receive a supply voltage, and the compensation voltage equals to the supply voltage minus the threshold voltage of the transistor.

16. The electronic device according to claim 15, wherein the magnitude of the current is zero.

17. The electronic device according to claim 14 further comprising a first transistor including a gate to receive the third control signal, a first terminal to receive a reference voltage, and a second terminal coupled to the second node of the capacitor.

18. The electronic device according to claim 17, wherein the transistor includes a first terminal configured to receive a supply voltage, and a difference made in a voltage at the first node in response to the third control signal is expressed as:

$$\Delta VA = (VDD - Vref) \times \left[\frac{Cfinger}{C1 + Cfinger}\right]$$

where ΔVA represents the difference made in the voltage at the first node, VDD represents the supply voltage, Vref represents the reference voltage, C1 represents a capacitance of the capacitor, and Cfinger represents the capacitance associated with the object.

19. The electronic device according to claim 18, wherein a difference made in the current in response to the third control signal is positively proportional to the ΔVA squared and is expressed as:

$$\Delta |Ids3| \propto \left[(VDD - Vref) \times \left(\frac{Cfinger}{C1 + Cfinger}\right)\right]^2$$

where Δ|Ids3| represents the difference made in the current.

* * * * *